United States Patent
Gheewala et al.

(10) Patent No.: US 6,838,713 B1
(45) Date of Patent: Jan. 4, 2005

(54) DUAL-HEIGHT CELL WITH VARIABLE WIDTH POWER RAIL ARCHITECTURE

(75) Inventors: Tushar R. Gheewala, Los Altos, CA (US); Michael J. Colwell, Fremont, CA (US); Henry H. Yang, San Jose, CA (US); Duane G. Breid, Lakeville, MN (US)

(73) Assignee: Virage Logic Corporation, Fremont, CA (US)

( * ) Notice: Subject to any disclaimer, the term of this patent is extended or adjusted under 35 U.S.C. 154(b) by 0 days.

(21) Appl. No.: 09/351,767

(22) Filed: Jul. 12, 1999

(51) Int. Cl.[7] .................... H01L 31/20; H01L 29/00; H01L 27/102; H01L 29/94; H03K 19/0175
(52) U.S. Cl. .................... 257/211; 257/55; 257/512; 257/562; 257/574; 257/300; 257/296; 257/261; 257/260; 376/63; 376/114
(58) Field of Search ................... 257/211, 55, 512, 257/562, 574, 300, 296, 261, 260; 326/63, 114

(56) References Cited

U.S. PATENT DOCUMENTS

| | | | |
|---|---|---|---|
| 4,701,778 A | * | 10/1987 | Aneha et al. ............. 257/207 |
| 4,745,084 A | | 5/1988 | Rowson et al. |
| 4,851,892 A | | 7/1989 | Anderson et al. |
| 5,038,192 A | | 8/1991 | Bonneau et al. |
| 5,079,614 A | | 1/1992 | Khatakhotan |
| 5,452,245 A | | 9/1995 | Hickman et al. |
| 5,631,478 A | | 5/1997 | Okumura |
| 5,635,737 A | | 6/1997 | Yin |
| 5,723,883 A | | 3/1998 | Gheewalla |
| 5,727,180 A | | 3/1998 | Davis et al. |
| 5,742,099 A | | 4/1998 | Debnath et al. |
| 5,861,641 A | * | 1/1999 | Yoeli et al. ............. 257/211 |
| 5,917,224 A | | 6/1999 | Zangara |
| 5,923,060 A | | 7/1999 | Gheewala |
| 5,981,987 A | | 11/1999 | Brunolli et al. |
| 6,091,090 A | | 7/2000 | Gheewala |
| 6,177,691 B1 | | 1/2001 | Iranmanesh et al. |
| 6,242,767 B1 | | 6/2001 | How et al. |
| 6,307,222 B1 | | 10/2001 | Brunolli et al. |
| 6,331,733 B1 | | 12/2001 | Or-Bach et al. |
| 6,445,049 B1 | * | 9/2002 | Iranmanesh ............. 257/401 |
| 6,445,065 B1 | | 9/2002 | Gheewala et al. |

OTHER PUBLICATIONS

Chingchi Yao et al., "An Efficient Power Routing Technique to Resolve the Current Crowding Effect in the Power Grid Structure of Gate Arrays", Seventh Annual IEEE International ASIC Conference and Exhibit.

Abbas El Gamal et al., "BINMOS: A Basic Cell for BiCMOS Sea–of–Gates", IEEE 1989 Custom Integrated Circuits Conference.

Yoshihiro Okuno et al., "0.8um 1.4MTr. CMOS SOG based on Column Macro–cell", IEEE 1989 Custom Integrated Circuits Conference.

* cited by examiner

*Primary Examiner*—David E. Graybill
*Assistant Examiner*—James Mitchell
(74) *Attorney, Agent, or Firm*—Townsend and Townsend and Crew LLP; Kenneth R. Allen

(57) ABSTRACT

A standard cell architecture with a basic cell that spans multiple rows of the standard cell. This multi-row basic cell may be a dual-height cell that spans two rows, or it may span more than two rows. The multi-row basic cell may be intermixed in a standard cell design with smaller, single-height cells for high-density applications. The single-height cells may be used where possible and higher-drive dual-height basic cells where larger transistors are desired. Other multiple height cells may also be included if even more current is desirable. The power rail may include conductors of varying width.

22 Claims, 4 Drawing Sheets

DUAL-HEIGHT CELL WITH VARIABLE WIDTH POWER RAIL ARCHITECTURE

BACKGROUND OF THE INVENTION

The present invention relates, in general, to cell-based integrated circuits such as standard cells, and in particular, to an improved standard cell architecture to achieve high density and improved power distribution.

Standard cell design technology has been developed as a method of quickly and efficiently designing integrated circuits. Standard cell technology is characterized by its fixed set of predesigned basic cells, which are preferably configured for dense placement and efficient signal routing. Typically, these basic cells are placed on the integrated circuit in an array pattern with rows and columns and are interconnected by conductive traces to form more complex logic structures.

To aid the designer, pre-designed circuit units generally known as "macro cells" comprising one or more basic cells are provided in libraries. Macro cells include commonly used elements such as NAND gates, NOR gates, and flip-flops. These libraries may also include macro cells specially designed for a particular task. A designer selects desired elements from the library of macro cells and places them in a design. The macro cells may then be further interconnected with other elements in a variety of ways to perform desired functions. By selecting macro cells from a library and placing them into a design, a designer can quickly design complex functions without having to worry about the details of each individual transistor. Typically, a library of macro cells is designed for a certain IC manufacturing technology, and their design characteristics are fixed for that technology.

One of the design tradeoffs in a macro cell library is the height of the basic cells. Standard cell sizes ranging in height from 7 to 15 tracks or more have been provided in previous standard cell architectures. As a general rule, a smaller cell height results in a higher gate density and hence a lower cost, but a small height cell has a small transistor that may not be able to deliver sufficient current for high-speed applications. So, standard cell architectures have typically provided standard cell sizes that are relatively large (10–12 tracks high) in order to handle those applications that require higher current. Unfortunately, these large cells sizes are inefficient for many specific instances in which the macro cells do not need the extra current generated by larger transistors.

To combat this problem, a technique has been developed in which two basic cells are stacked together to make a single large double high cell for those macro cells in which larger transistors are needed. However, this technique introduced additional routing problems because of interconnections between the top and bottom stacked cells. The power rails (VDD and VSS) were routed horizontally through the cell on first level metal and, as a result, the second metal layer was used to make vertical connections between the top and the bottom halves of the stacked cell. In a three metal layer design, the second metal layer is important for global routing of signals and for accessing the input and output terminals inside of a cell. Consequently, these conventional dual-height cells resulted in designs with low area efficiency and have therefore not been popular.

SUMMARY OF THE INVENTION

The present invention provides a standard cell architecture with a basic cell that spans multiple rows of the integrated circuit. This multi-row basic cell may be a dual-height cell that spans two rows, or it may span more than two rows. The multi-row basic cell may be intermixed in a standard cell design with smaller, single-height cells for high-density applications. The single-height cells may be used where possible and higher-drive dual-height basic cells used where large transistors are desired. Other multiple height cells may also be included if larger transistors are desirable. Thus, a single library can meet the diverse needs for both high-density and high-drive applications.

To minimize global routing blockage, the power rail is located on a second layer of metal (M2), while interconnections within the basic cell to form macro cells are made on a first layer of metal (M1) located between the second level metal and the substrate. This leaves the second metal layer open for global routing. In other embodiments, the power rail may be located on a third metal layer (M3) located further away from the substrate than the M2 layer.

In another aspect of the present invention, the width of the power rails may be of variable width without altering the underlying basic cells. The designer can thereby choose larger power rails if needed for a high power design, but if they are not needed then smaller power rails can be chosen to leave more room free for signal routing. Different power rail widths may even be combined within the same design.

Further features of the invention, its nature and various advantages will be more apparent from the accompanying drawings and the following detailed description of the specific embodiments.

DESCRIPTION OF THE SPECIFIC EMBODIMENTS

Figure 1:
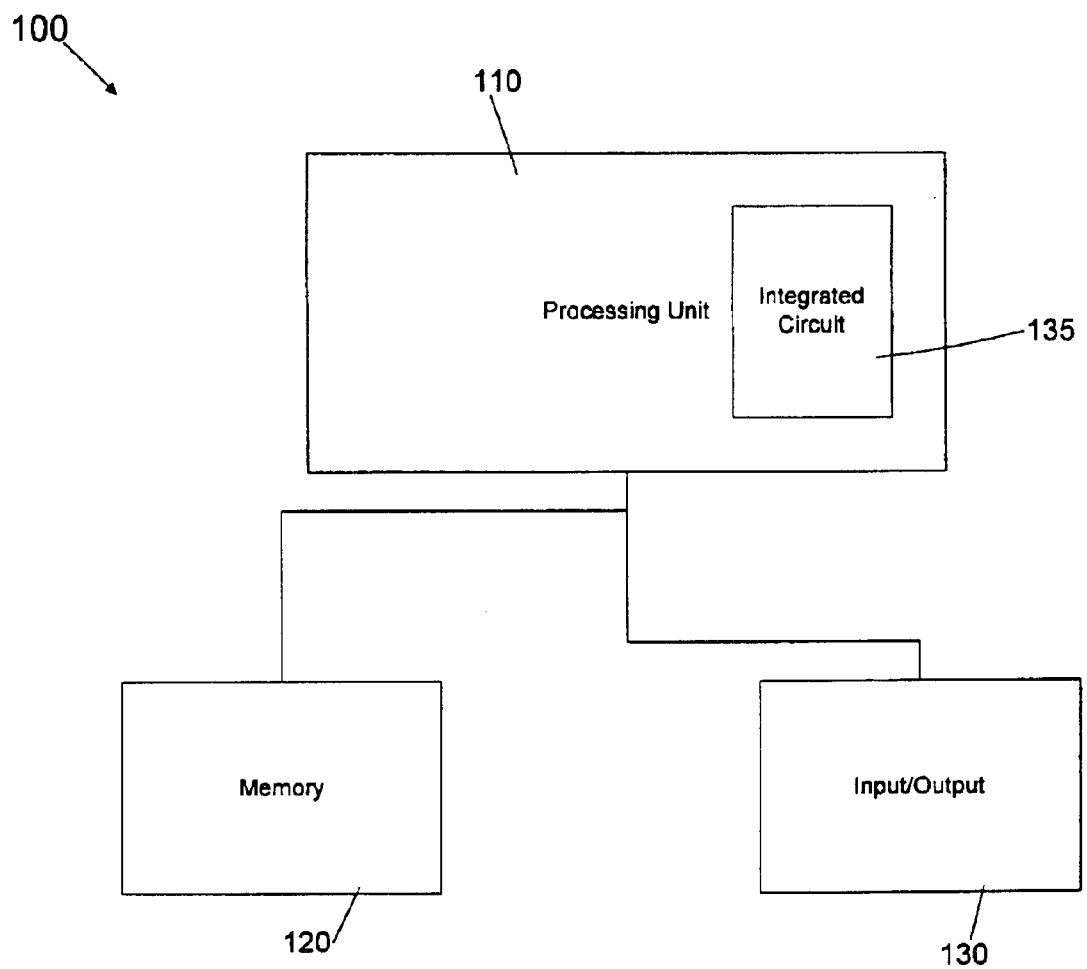
FIG. 1 is a block diagram of a digital system into which an integrated circuit of the present invention may be incorporated.

FIG. 1 is a block diagram of a digital system 100 into which an integrated circuit of the present invention may be incorporated. Digital system 100 may include a processing unit 110 coupled to a memory 120 and an input/output device 130. Processing unit 110 includes a standard cell integrated circuit 135 according to the present invention. Other elements (not shown) may also be included in digital system 110. In some embodiments one or more of the elements shown may be excluded. Although integrated circuit 135 is shown as a part of processing unit 110, it may also be included in any or all of the elements of digital system 100. Alternatively, digital system 100 may be entirely formed as a single integrated circuit 135.

Digital system 100 may be used for a variety of applications including, but not limited to, consumer electronics, graphics applications, telecommunications and the like. A personal computer is an example of digital system 100, but it may also be other electronic devices such as modems, hand-held gaming devices, portable telephones, graphics processors, pc adapter boards, switching devices, display units, and the like. Integrated circuit 135 is especially well suited for applications that require high-speed operations for some of its function, but do not require high speed operations for other functions.

Figure 2:
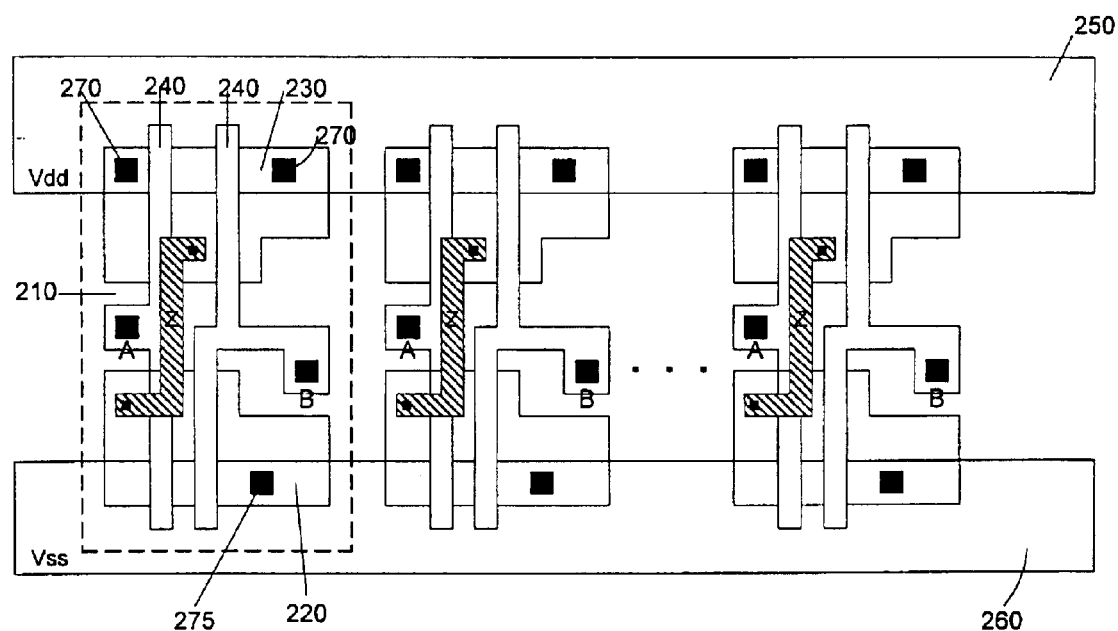
FIG. 2 is a layout diagram of a row of single-height basic cells of the present invention.

FIG. 2 is a layout diagram of a row of single-sized basic cells 210 in a standard cell design according to the present invention. Basic cell 210 typically has an n-type diffusion region 220 and a p-type diffusion region 230. A polysilicon region 240 bisects diffusion regions 220 and 230 to form gate regions of p-type transistors and n-type transistors for CMOS technology. Of course, differently doped regions may be more appropriate for technologies other than CMOS and such technologies are included in the present invention. Basic cell 210 in the specific embodiment has two such polysilicon regions 240 crossing both diffusion regions 220 and 230 forming a total of four transistors, but any number of diffusion regions 220 and/or polysilicon regions 240 may be included.

The present invention is not limited to basic cell 210 shown in FIG. 2. It may be replaced by any number of other basic cells designs. For example, the basic cell described in commonly assigned U.S. Pat. No. 5,723,883, which is incorporated herein by reference for all purposes, may be substituted for basic cell 210.

Conductive traces 250 and 260 extend across the rows of basic cells 210 forming power rails. Although only two conductive traces are shown, the specific embodiment includes several rows of conductive traces which alternate between VDD conductors and VSS conductors. Thereby, each basic cell in a row has access to both VDD and VSS power supply reference voltages.

Conductive trace 250 is coupled to the VDD power supply. It extends across the top of the row of basic cells 210. Thus contact may be made between conductive trace 250 and p-type diffusion region 230 with minimum amount of routing. Similarly, conductive trace 260 is coupled to the VSS power supply and extends across the bottom of the row of basic cells 210. Traditionally, the power rail for standard cell integrated circuits has been located on the M1 layer (the first metal layer above the substrate.) In an embodiment of the present invention, the power rail is instead located on the M2 layer (the metal layer above the M1 layer.) The basic concept of routing a power rail for standard cells on the M2 layer is described in commonly assigned U.S. patent application Ser. No. 08/933,522 filed Sep. 19, 1997, entitled "Power and Signal Routing Technique for Gate Array".

With this structure, various macro cells implementing logic functions such as NAND, NOR, XOR, flip-flops or more complicated functions may be formed. For example, each basic cell 210 shown in FIG. 2 is configured as a two-input NAND gate (Z=A NAND B). Contacts 270 couple the p-type diffusion region 220 to VDD through conductive trace 250 forming the p-logic tree of the CMOS circuit. Similarly, contacts 275 couple the n-type diffusion region 210 to VSS through conductive trace 260 forming the n-logic tree. A logic conductor 280 couples p-type diffusion region 220 with n-type diffusion region 210 and forms the common node between the p-logic tree and n-logic tree in the CMOS circuit. One of the polysilicon regions 240 may be coupled to conductors supplying an A-input and the other may be coupled to conductors supplying a B-input. The Z-output is taken from logic conductor 280. It will be apparent to one of skill in the art that the particular arrangement shown in FIG. 2 is a NAND gate; but, by changing the topology and/or connections of diffusion, polysilicon and metal regions, other logic functions may be formed.

Figure 3:
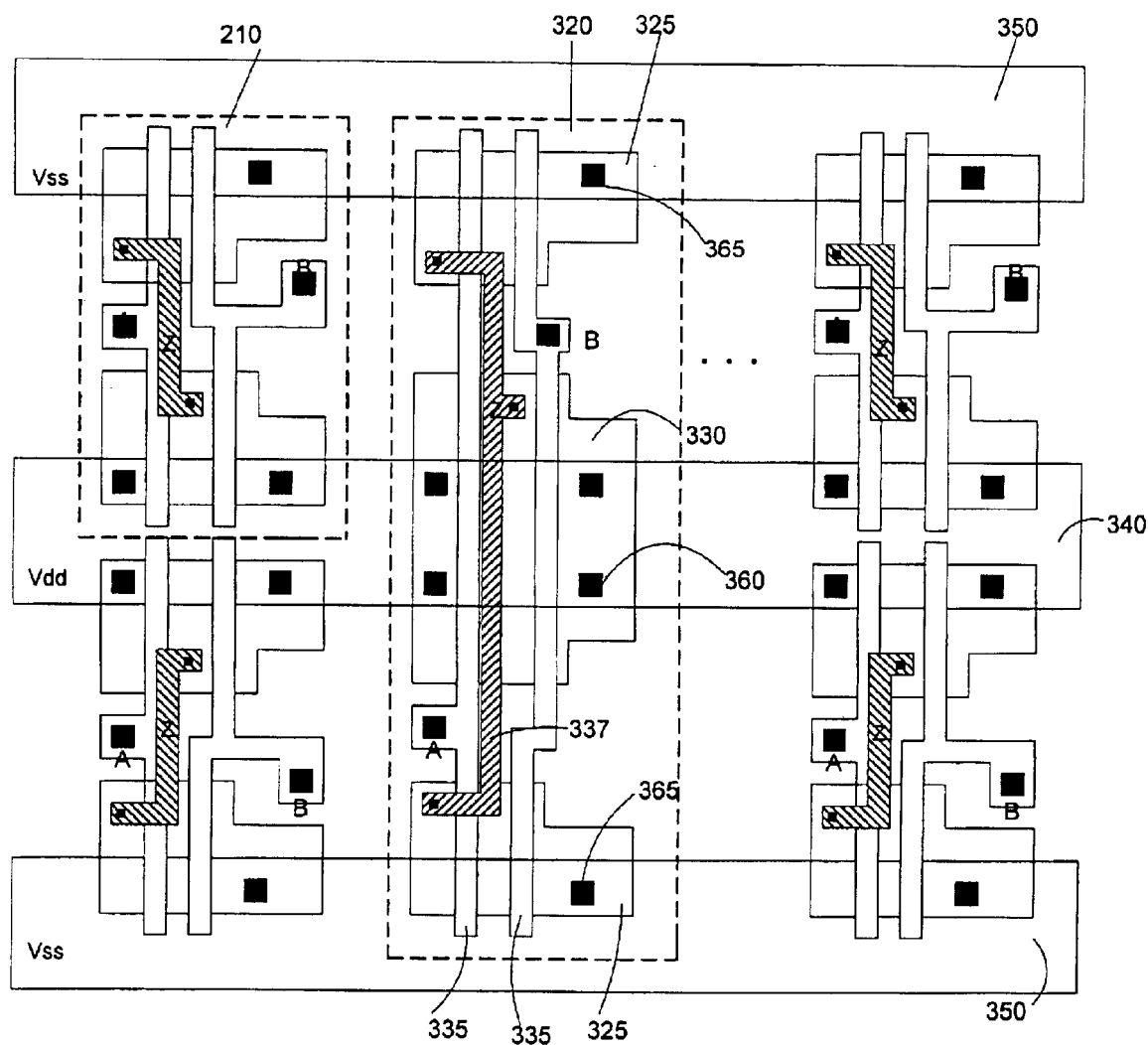
FIG. 3 is a layout diagram of two rows of basic cells including single-height and double-height basic cells according to the present invention.

FIG. 3 shows a layout diagram with two rows of basic cells according to an embodiment of present invention. The two rows include single-sized basic cells 210 as described above, but also include dual-sized basic cell 320. Dual-sized basic cell 320 is twice the height of single-sized basic cell 210. Other multi-row basic cells (not shown) may also be included. For example a triple-sized basic cell (not shown) or a quad-sized basic cell (not shown) may be included that are three and four times, respectively, the height of single-sized basic cell 210. Multi-row basic cells such as dual-sized basic cell 320 extend in a column across two or more rows of the integrated circuit. To maintain the symmetry and ease of design, it is desirable that the multi-row basic cells be an integer multiple size to single-sized basic cell 210.

To allow for efficient standard cell design, single-sized basic cell 210 may be appropriately sized for the particular applications for which the integrated circuit is intended. In the specific embodiment, single-sized basic cell 210 is seven tracks high. In other embodiments, single-sized basic cells of six and eight tracks are also preferably used, although other sized basic cells may be desirable for some applications, also. The number of tracks may be optimized for particular applications depending on the amount of current the majority of the transistors need to drive in an intended application. Thus, if a 6-track high cell will suffice for most of the transistors, then it is more efficient to use a 6-track high cell for single-size basic cell 210 and use a dual-sized basic cell 320, as will be described below, for those transistors that need to drive more current. However, if most of the transistors will need to drive more current than will be provided by a 6-track cell, then it would be inefficient to choose a 6-track cell as the single-sized basic cell. In such cases, a larger single-sized basic cell should be preferably used.

Dual-sized basic cell 320 is twice the height of single-sized basic cell 210. In the specific embodiment it is therefore 14 tracks high. Dual-sized basic cell 320 may include two single-sized basic cells 210 stacked one on top of the other and coupled together to form a dual-sized basic cell. The top cell may be a mirror image of the bottom cell as if the bottom cell had been reflected along its top edge. Logic conductors on the M1 metal layer couple diffusion regions 220 and 230 of the stacked basic cells 210 to their counterparts in the mirrored cell. Polysilicon regions 240 are extended to couple with the polysilicon regions 240 of the mirrored cell. Since the power rail conductors are on the M2 layer, they do not block routing on the M1 layer between the top and the bottom sections of a dual height cell. In the prior architectures, the power rails were on the M1 layer, thus requiring the use of M2 to connect between the top and the bottom halves of a double height cell.

In the specific embodiment shown in FIG. 3, dual-sized basic cell 320 is not a direct mirror image as described above, but instead is a simplified layout that accomplishes a similar—and in some aspects better—result. Since it is not necessary to provide contacts to the inputs in both the upper and lower rows (since they are duplicate functions), this simplification is appropriate. Dual-sized basic cell 320 has two n-type diffusion regions 325 and a p-type diffusion region 330. By this design, p-type diffusion region 330 may be made much larger without increasing the height of dual-sized basic cell 320. One advantage of this layout is that many applications require a larger p-type diffusion region than n-type diffusion region and it can be provided without increasing the number of tracks. Polysilicon regions 335 extend across diffusion regions 325 and 330 to form transistors.

A logic connection 337 couples the common connection between the p-tree and the n-tree of the CMOS layout in the upper portion of dual-sized basic cell 320 with those in the lower portion. This duplicates the functionality and effectively makes the dual-sized basic cell 320 operate functionally the same as single-sized basic cell 210, but with more than twice the transistor size. Logic connection 337 is located on the M1 layer. This helps to minimize the blocking of global routing on the integrated circuit. In other embodiments, it may be located on other layers.

As is well known in the art, an integrated circuit may have a plurality of metal layers above the substrate. In the specific embodiment, the rows of basic cells are covered by three layers of metal, M1, M2, and M3. Each layer of metal is separated from the other by an insulating layer. The M1 layer is nearest the substrate, the M2 layer is above M1 layer, and the M3 layer is above the M2 layer and is the farthest layer from the substrate. If desired, additional metal layers may also be used.

The present invention includes VDD conductive traces 340 and VSS conductive traces 350. In the specific embodiment, conductive traces 340 and 350 extend across the integrated circuit on the M2 layer. In other embodiments, VDD conductive traces 340 are on the M2 layer and VSS conductive traces 350 are on a different metal layer or vice versa VDD conductive traces 340 and VSS conductive traces 350 alternate so that each row of basic cells has a VDD conductive trace 340 and an adjacent VSS conductive trace 350. Basic cells 210 and 320 are located under conductive traces 340 and 350 such that the p-type diffusion region is near VDD conductive trace 340 and the n-type diffusion region is near VSS conductive trace 350. Basic cells 210 on adjacent rows may be flipped vertically so they can share power rails between rows. Stacked via contacts 360 and 365 may be used to couple conductive traces 340 and 350, respectively, with individual basic cells.

In one of the preferred implementation of the current invention, VDD conductive trace 340 preferably extends over the p-type diffusion region of basic cells 210 and 320 and is coupled with a VDD power supply source (not shown). They may be, for example, coupled to a VDD power bus located at a lateral edge of the array in a column outside the rows of basic cells 210 and 320. The VDD power bus (not shown) is connected to the VDD power supply source. Similarly, VSS conductive traces 350 preferably extend over the n-type diffusion regions of each of the rows of basic cells. VSS conductive trace 350 may be, for example, coupled to a power bus located at a lateral edge of the array in an column outside basic cells 101, which is coupled to a VSS power supply source (not shown.) Alternatively, the VDD and VSS power supplies may be coupled to conductive traces 340 and 350 respectively through power bus traces running parallel to columns of the array on the third metal layer.

Figure 4:
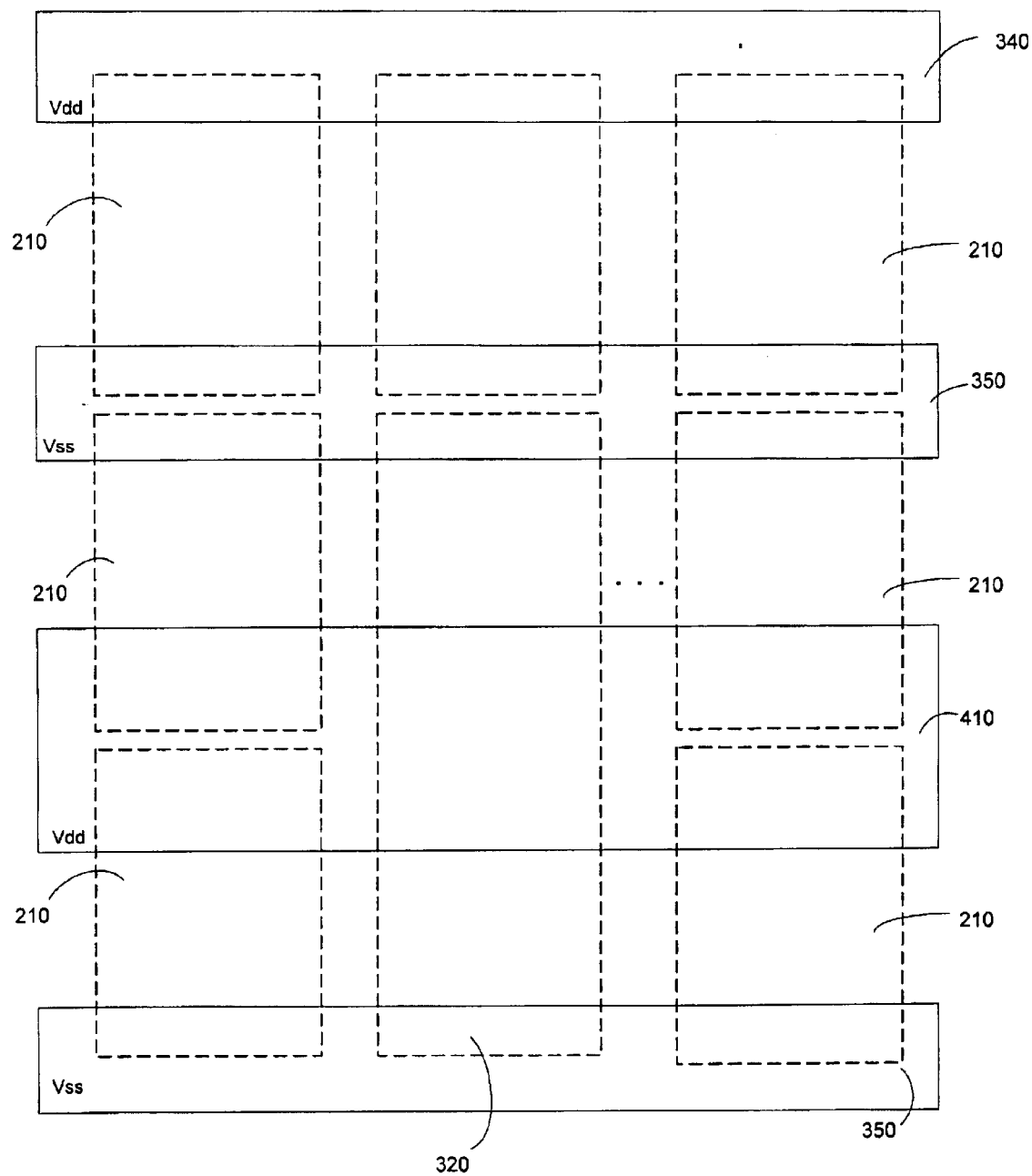
FIG. 4 is a layout diagram of three rows of basic cells showing variable width power rails.

In another aspect of the present invention, the width of conductors 340 and 350 may be varied without affecting the layout of the basic cells 210 and 320 beneath them. Thus— depending on the power requirement of a design—one, two, or three track wide power conductors may be used. Wider power conductors may also be used. FIG. 4 shows a layout diagram of three rows of an integrated circuit with a combination of single-sized basic cells 210 and dual-sized basic cells 320. It further shows conductive traces 340 and 350. These conductive traces are of the same width. A double-wide VDD conductive trace 410 is also included and is twice the width of conductive traces 340 and 350. According to this aspect of the present invention, any or all of the power rail conductive traces may be single track wide for low power applications such as portable electronics, or may be multiple tracks wide for high power applications such as graphics. Although only VDD conductive trace 410 is shown as being of varying widths, the width of VSS conductive traces 350 may also be varied. Different rows on the standard cell, or even different sections within a row on the standard cell, may have different sized power rails. Also, different integrated circuits may have different sized power rails while using the same macro cell library.

While a specific embodiment of the invention is described herein, it will be recognized that changes may be made without departing from the spirit and scope of the present invention. For example, to solve some routing problems, it may be desirable to depart from the described layout architecture occasionally throughout the integrated circuit. Also some interconnections for a particular basic cell may be made on a different metal layer than M1 to solve a localized routing problem. Although the invention is described for standard cell designs, it is equally applicable to gate array and data path style of designs. The specific embodiment above is intended by way of description for the understanding of the invention and no limitation is intended or implied. The invention is intended to be limited only by the attached claims.

What is claimed is:

1. A layout architecture for a standard cell integrated circuit having an array of logic calls comprising:
   a substrate;
   a first metal layer;
   a second metal layer wherein the first metal layer is disposed between the second metal layer and the substrate;
   a plurality of first conductors, each of said plurality of first conductors being coupled to a power supply and extending across the logic cells on the second metal layer, wherein adjacent one of the first conductors are coupled to different supply voltages;
   a logic cell positioned nth thee or more adjacent first conductors wherein the logic cell is coupled to the three or more adjacent first conductors; and
   a second conductor on the first metal layer coupling a portion of the logic cell on a first side of a middle first conductor of the three or more adjacent conductors with a portion of the logic cell on a second side of the middle first conductor.

2. The layout of claim 1 wherein a midpoint of the logic cell is located under the middle first conductor.

3. The layout of claim 1 further comprising a third metal layer disposed between the first and second metal layers.

4. The layout of claim 1 wherein the logic cell further comprises:
   a p-type diffusion region under the middle first conductor; and
   first and send n-type diffusion regions under the first conductors adjacent the middle first conductor, wherein the p-type diffusion region and the first and second n-type diffusion regions are coupled by to second conductor.

5. The layout of claim 4 wherein the middle first conductor is coupled to a VDD supply voltages and the first conductor adjacent the middle first conductor are coupled to a VSS supply voltage.

6. A digital system comprising an integrated circuit with the layout architecture of claim 1.

7. The layout architecture claim 1 wherein the assay of logic cells have rows of a fixed height and the logic cell spans two rows of the array.

8. The layout architecture of claim 7 wherein the plurality of first conductors extend across the logic cell in a direction parallel to the rows.

9. The layout architecture of claim 1 wherein no conductors reside between adjacent first conductors on the second metal layer.

10. A layout architecture for a standard cell integrated circuit comprising:

a substrate;

a first metal layer;

a second metal layer wherein the first metal layer is disposed between the second metal layer and the substrate;

a first plurality of power supply conductors coupled to a first supply voltage extending across the integrated circuit in a first direction;

a second plurality of power supply conductors coupled to a second supply voltage extending across the integrated circuit and alternating with the first plurality of power supply conductor, whereby adjacent ones of the power supply conductors are coupled to different supply voltages;

a first logic cell positioned underneath a first power supply conductor from the first plurality of power supply conductors and a second power supply conductor from the second plurality of power supply conductors, the first power supply conductor being adjacent to the second power supply conductor;

a second logic cell posited underneath the first and second power supply conductors and a third power supply conductor from the second plurality of power supply conductors the third supply conductors being adjacent the first power supply conductor; and a logic conductor coupling a portion of the second logic cell on one side of the first power supply conductor to a portion the second logic cell on the other side of the first power supply conductor on the first metal layer.

11. The layout architecture of claim 10 wherein the first plurality of power supply conductors is on the second metal layer.

12. The layout architecture of claim 11 wherein the second plurality of power supply conductors is on the second metal layer.

13. The layout architecture of claim 12 further comprising a third metal layer disposed between the first and second metal layers.

14. The layout architecture of claim 11 further comprising a third metal layer disposed between the first and second metal layers.

15. The layout architecture of claim 10 wherein the second logic call further comprises a plurality of first logic cells stacked in a second direction orthogonal to the first direction.

16. The layout architecture of claim 10 wherein the second logic cell is an integer multiple number of tracks larger than the first logic cell.

17. The layout a architecture of claim 10 wherein the second logic cell is twice the height of the first logic cell.

18. The layout a architecture of claim 10 wherein the first power supply conductor is coupled to a VDD voltage and the second and third power supply conductors are coupled to a VSS voltage.

19. The layout a architecture of claim 10 wherein the second logic cell further comprises two mirror-image first logic cells stacked in the same column.

20. The layout a architecture of claim 10 wherein the second logic cell further comprises:

a p-type diffusion region under the first power supply conductor; and first and second n-type diffusion regions under the second and third power supply conductors receptively, wherein the p-typo diffusion region and the first and second n-type diffusion regions are coupled by the logic conductor.

21. The layout architecture of claim 10 wherein the plurality of first power supply conductors are of varying widths.

22. The layout architecture of claim 10 wherein the plurality of second power supply conductors are of varying widths.

* * * * *

UNITED STATES PATENT AND TRADEMARK OFFICE
CERTIFICATE OF CORRECTION

PATENT NO. : 6,838,713 B1
DATED : January 4, 2005
INVENTOR(S) : Gheewala et al.

It is certified that error appears in the above-identified patent and that said Letters Patent is hereby corrected as shown below:

Column 6,
Line 38, delete "nth thee" and insert -- beneath three --.
Line 54, delete "send" and insert -- second --.
Line 65, delete "assay" and insert -- array --.

Signed and Sealed this

Fourteenth Day of February, 2006

JON W. DUDAS
*Director of the United States Patent and Trademark Office*